United States Patent [19]

Bright

[11] Patent Number: 4,726,793
[45] Date of Patent: Feb. 23, 1988

[54] ELECTRICAL SOCKET, APPLICATION TOOL AND METHOD FOR POSITIONING ELECTRICAL SOCKETS ON CIRCUIT BOARDS FOR SURFACE SOLDERING

[75] Inventor: Edward J. Bright, Elizabethtown, Pa.

[73] Assignee: AMP Incorporated, Harrisburg, Pa.

[21] Appl. No.: 27,771

[22] Filed: Mar. 19, 1987

Related U.S. Application Data

[62] Division of Ser. No. 826,932, Feb. 6, 1986, Pat. No. 4,679,318.

[51] Int. Cl.$^4$ .............................................. H01R 13/04
[52] U.S. Cl. ................................................... 439/751
[58] Field of Search ......................... 439/751, 733, 873

[56] References Cited

U.S. PATENT DOCUMENTS 4,188,715  9/1977  Ammon ................................ 439/751
4,655,528  4/1987  Groft ................................. 339/99 R

OTHER PUBLICATIONS

"AMP" Technical Paper, P275-285, Microelectronic Socketing-Beyond the Dip.

*Primary Examiner*—Joseph H. McGlynn
*Attorney, Agent, or Firm*—Allan B. Osborne

[57] ABSTRACT

An electrical socket, an application tool and a method for seating solder feet on contact elements in the electrical socket in solder paste deposited on conductive pads on circuit boards. The electrical socket includes a plurality of contact elements having spring arms at one end and solder feet at another end. The contact elements are slidably retained in cavities in the socket housing. The application tool includes depending pins which frictionally engage spring arms on the contact elements so that the solder feet are seated in the paste by pushing on the application tool.

7 Claims, 15 Drawing Figures

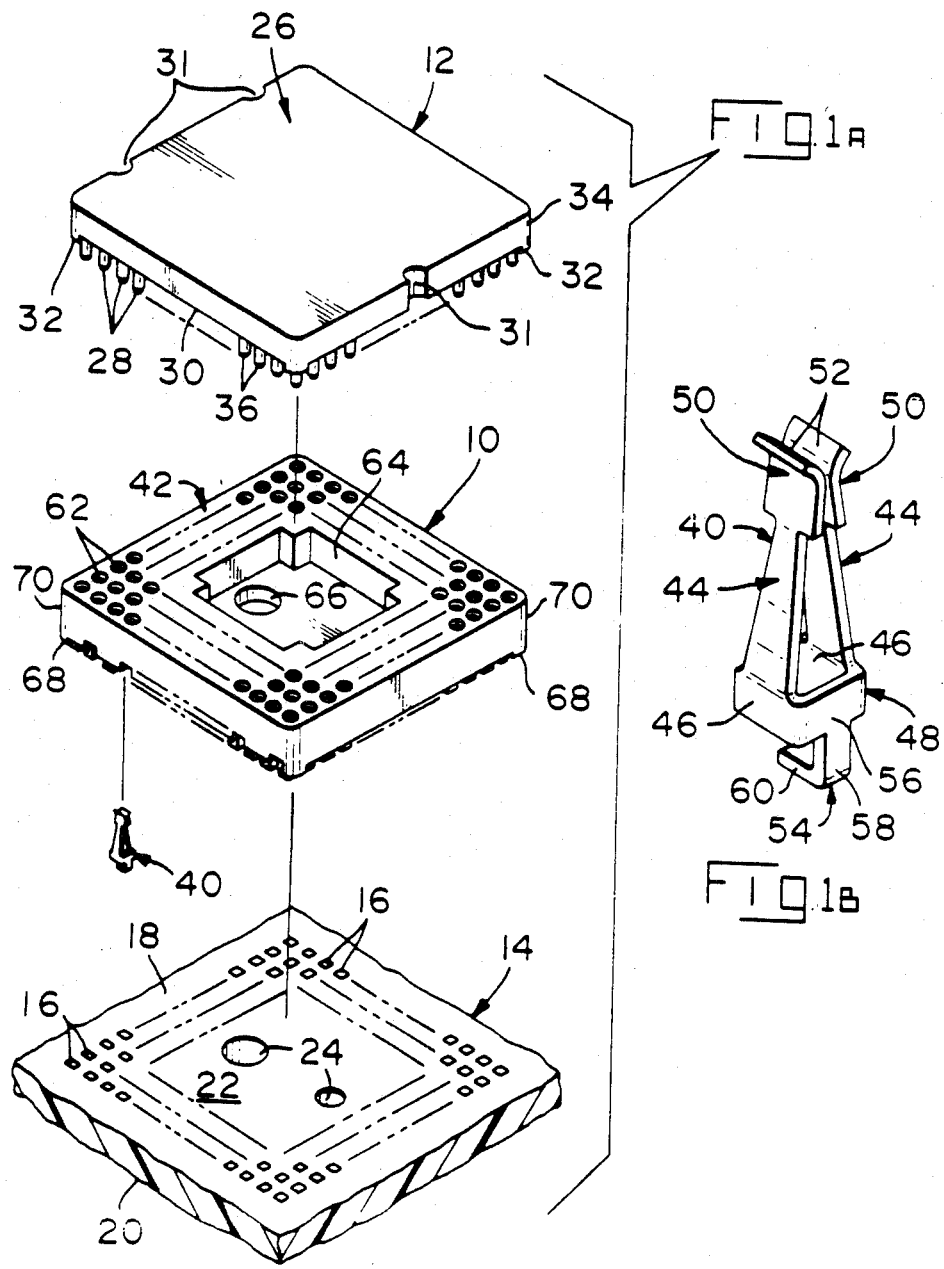

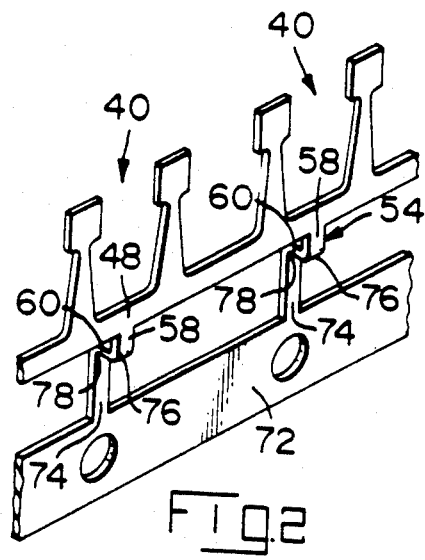
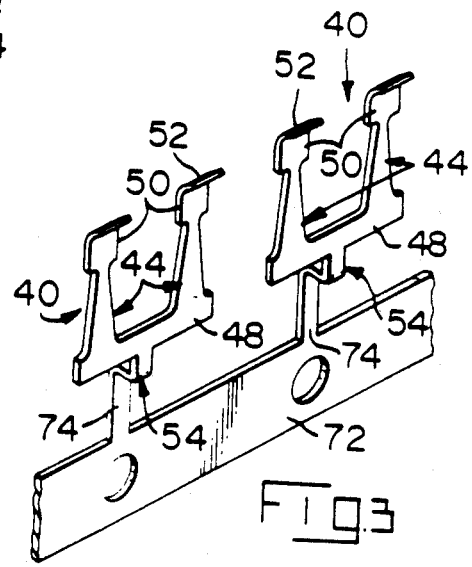
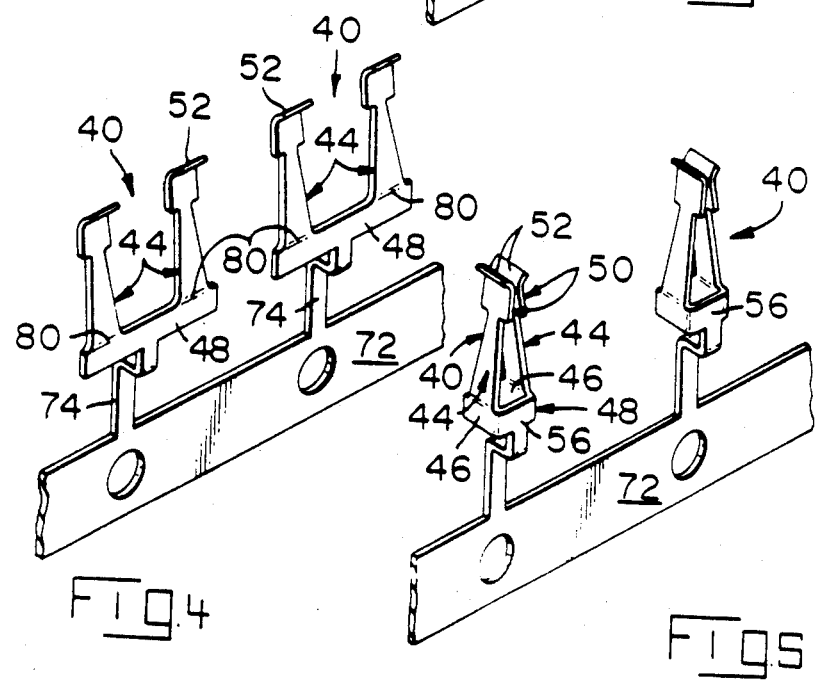
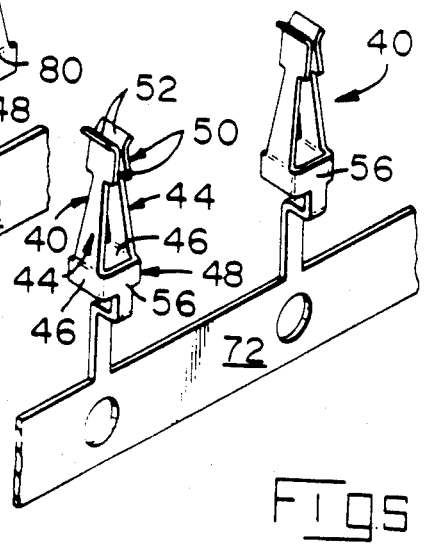

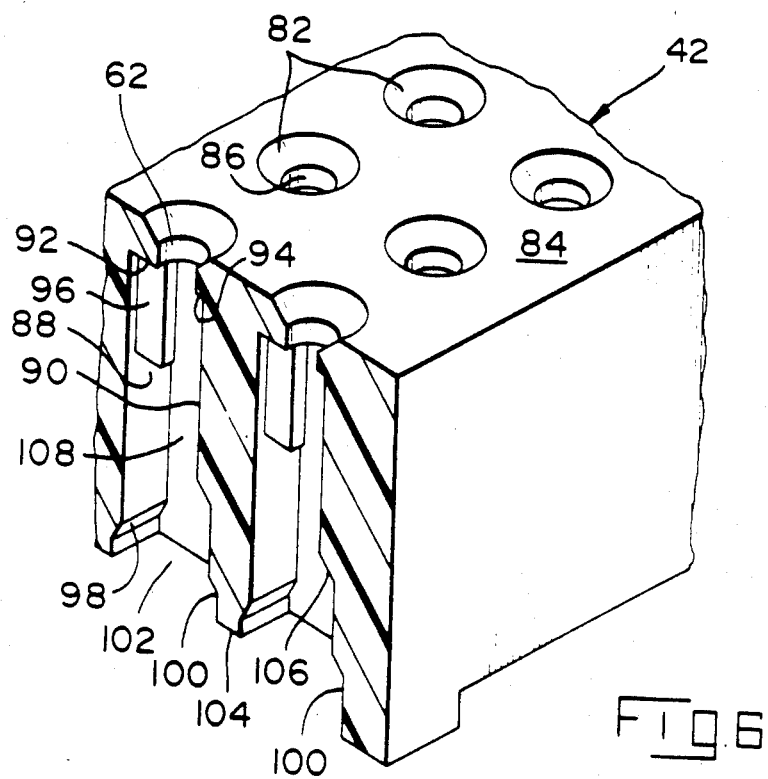

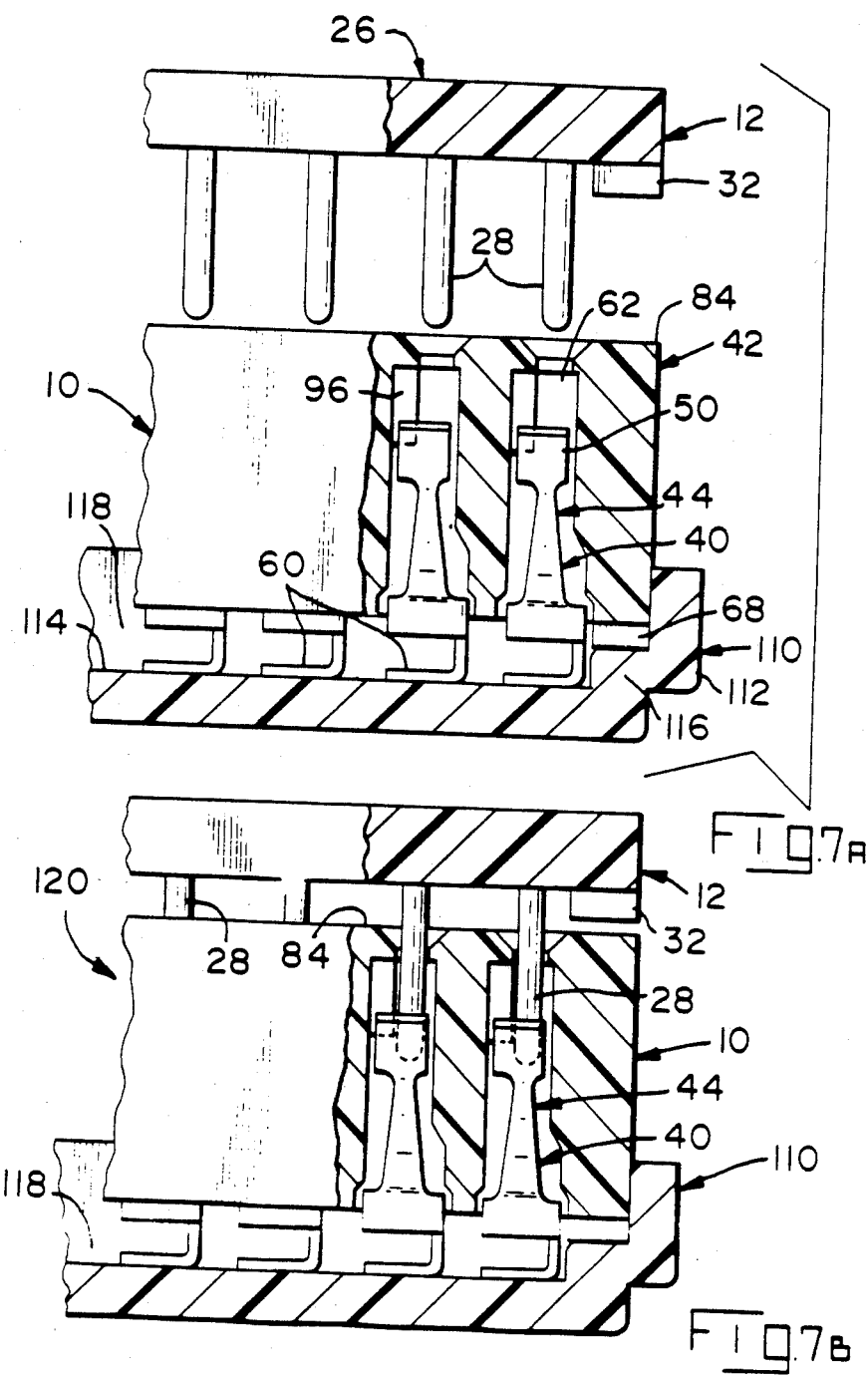

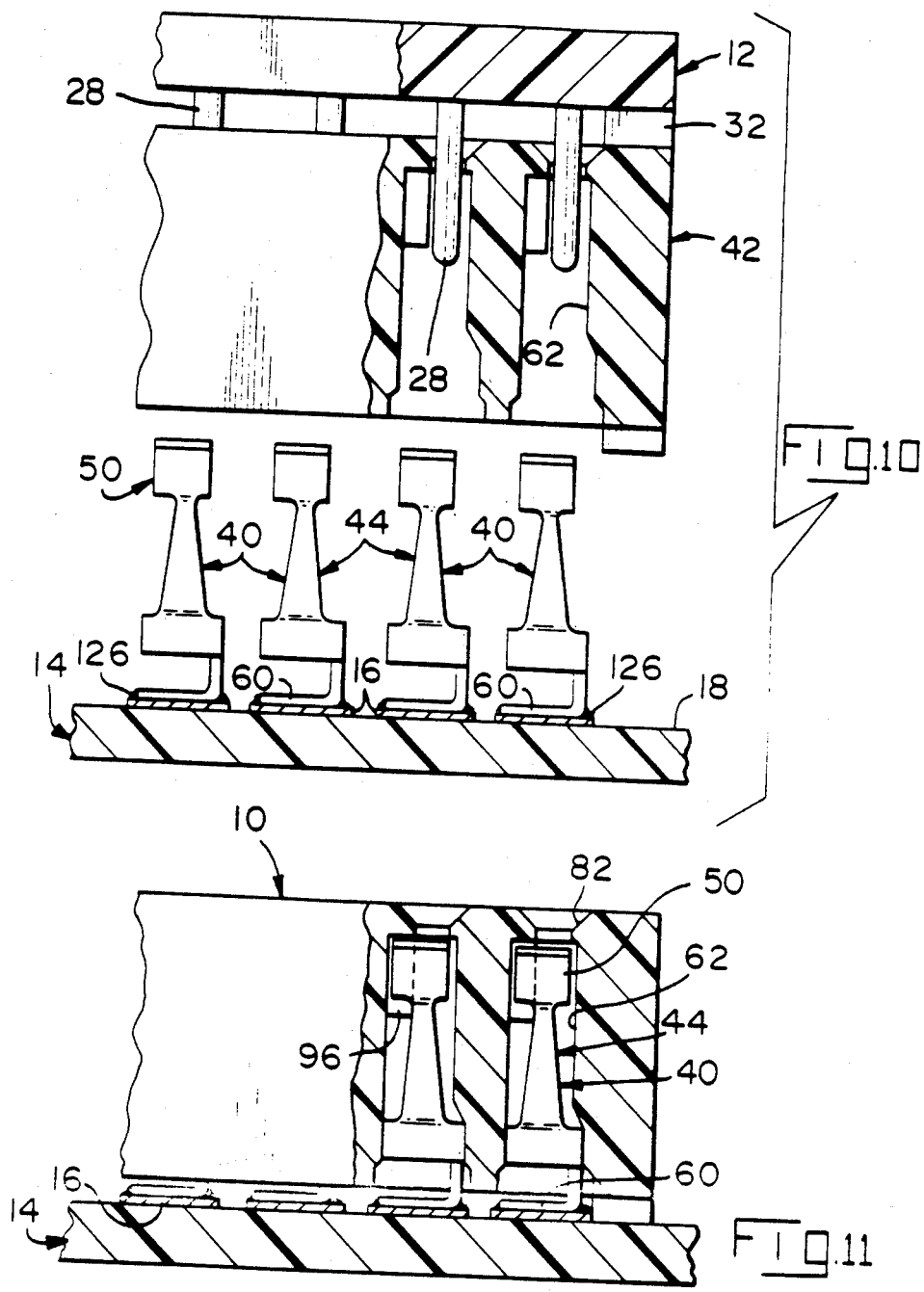

ELECTRICAL SOCKET, APPLICATION TOOL AND METHOD FOR POSITIONING ELECTRICAL SOCKETS ON CIRCUIT BOARDS FOR SURFACE SOLDERING

This is a division of application Ser. No. 826,932, filed Feb. 6, 1986, now U.S. Pat. No. 4,679,318.

FIELD OF THE INVENTION

The present invention relates to an electrical socket, an application tool and a method of using the tool to position electrical sockets on circuit boards and more particularly to uniformly seat the solder feet on the sockets in solder paste on conductive pads on the circuit board.

BACKGROUND OF THE INVENTION

It is well known in the art to solder electronic package receiving sockets to circuit boards, particularly to meet military and aircraft manufacturers' requirements. In those cases where sockets have solder tail leads which are received and soldered in holes in the board, soldering processes are generally well defined. Soldering sockets having solder feet to conductive pads on a circuit board; i.e., surface mount soldering, is, on the other hand, susceptible to failures due principally to faulty preparation prior to soldering which leads to cracks and at times total breakage at the solder joint. Generally, the faulty preparation arises from solder feet on the contact elements not being completely in contact with the solder paste because of accumulative tolerance conditions in manufacturing the contact elements and socket housings, circuit board bowing and solder paste deposition. Sockets having solder feet along the edges and projecting outwardly can be visually inspected just prior to soldering as well as afterwards to detect such problems. However, sockets having an array of solder feet both along the edge and interiorly; e.g., pin grid array sockets, are not susceptible to visual inspection and accordingly surface mounting of these type sockets has been troublesome. Further, the problems are not minor when a large number of contact elements are involved. Currently, 324 contact elements are now common in pin grid array (PGA) sockets and it is expected that the number will reach 1000 in the near future.

One approach to solving these problems would be to remove the housing on a PGA socket to visually inspect the positioning of the solder feet in the solder paste before soldering. However, removing the housing would actually aggravate the problems through inadvertent dislodging of the contact elements.

A solution to the aforementioned problems would be the use of an application tool removably mounted on the socket and having pins which enter the socket and push on the contact elements to simultaneously and uniformly seat the solder feet into the solder paste.

SUMMARY OF THE INVENTION

According to the present invention, an electrical socket, an application tool and a method for use in surface mounting electrical sockets on circuit boards insures that the solder feet on the contact elements in the sockets are uniformly and accurately seated in the solder paste in preparation for soldering. The electrical socket includes a dielectric housing with cavities therethrough and a plurality of contact elements slidably retained in the cavities. The application tool includes a body member having a plurality of depending pins on the same pattern array as the contact elements in the socket. The method includes placing the socket on the conductive pads on the circuit board on which solder paste has been deposited, positioning the application tool on the socket and, by pushing on the tool, simultaneously seating the solder feet in the paste. Another method places the application tool on the socket, placing this assembly on the circuit board either manually or robotically and pushing on the tool to seat the solder feet in the paste. Thereafter the socket and board is soldered with the application tool still in place, removing it after soldering.

BRIEF DESCRIPTION OF THE DRAWINGS

FIG. 1-A is a perspective view showing an electrical socket, a section of a circuit board to which the socket is to be solder-mounted and an application tool for use in solder-mounting the socket;

FIG. 1-B is a perspective view of a contact element from the socket;

FIGS. 2, 3, 4 and 5 are perspective views illustrating the progressive forming of a pair of contact elements housed in the socket shown in FIG. 1-A;

FIG. 6 is a perspective, partly sectioned view of a portion of the housing of the socket showing the contact element cavities therein;

FIG. 7-A is a side elevation, sectional view of the socket positioned in a carrier and the application tool above the socket prior to its positioning therein;

FIG. 7-B is a side elevation, part sectional view of the socket in the carrier and with the application tool positioned therein;

FIG. 8-B is an enlarged view of a portion of FIG. 8-A showing contact element solder feet in relation to the underlying solder paste on a circuit board conductive pad;

FIG. 9-B is an enlarged view of a portion of FIG. 9-A showing the relationship between the solder foot, solder paste and conductive pad;

FIG. 10 is a side elevation, part sectional view showing the removal of the socket housing to permit a visual check of the soldered contact elements after soldering; and FIG. 11 is a side elevation, part sectional view showing the housing replaced on the contact elements.

DESCRIPTION OF THE INVENTION

Figure 8A:
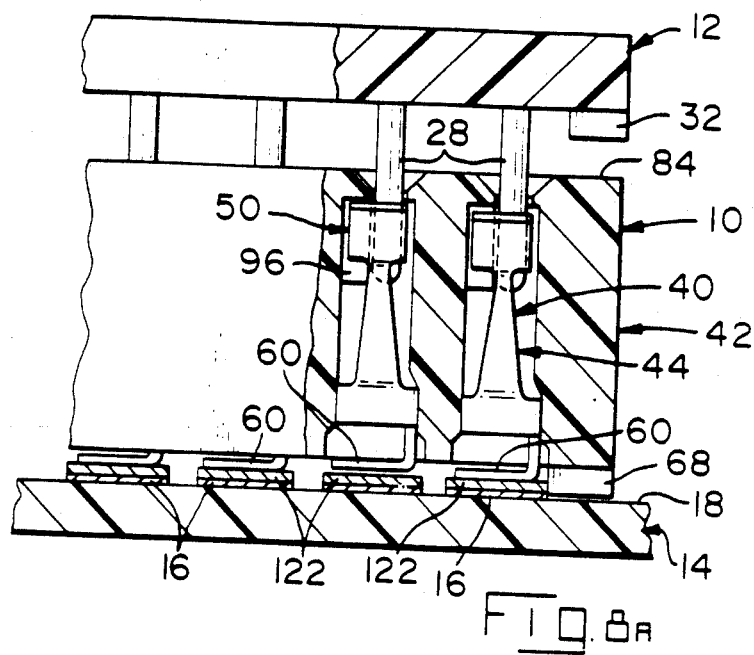
FIG. 8-A is a side elevation, part sectional view of the socket and application tool preliminarily positioned on the circuit board.

FIG. 1 is a view showing socket 10, application tool 12 and circuit board 14 on which socket 10 is to be solder-mounted.

Circuit board 14 is a typical multi-layer laminate having conductive pads 16 on one or both upper and lower surfaces 18, 20, respectively, with conductive circuit traces (not shown) extending to pads 16. Groups of pads 16 are arranged in a given pattern array depending upon the electrical component to be received thereon. The pattern shown on board 14 is a square array defined by spaced-apart pads 16 on closely-spaced centers with a center area 22 in which alignment holes 24 are located. Holes 24 may extend through the board and may be of different sizes or asymmetrically arranged to provide polarization for mounting socket 10 thereon.

Application tool 12 includes a body member 26 and a number of pins 28 projecting outwardly from surface 30 of member 26. Body member 26 is made from any suitable material; e.g., a polyethelene terephthalate resin, and preferably has spatial dimensions substantially similar to that of the socket; e.g., socket 10, with which it will be used. Arcuate cutouts 31 are provided on opposing edges of body member 26. Pins 28 are on the same pattern array as contact elements 40 in socket 10. A number of posts 32 depend from surface 30. Posts 32 are provided at each corner 34 and are formed as an integral part of body member 26.

If tool 12 is to be of the disposable type, pins 28 may be made form a suitable rigid and economical material; e.g., molded as an integral part of body member 26. In the case of a more permanent-type tool 12, pins 28 would be made from stainless steel or the like and riveted or molded into body member 26. Pins 28, shown as cylindrical, could be rectangular in cross-section.

Tips 36 on pins 28 are preferably rounded although they could be beveled or tapered. The number of pins 28 provided depends on the particular socket; e.g., socket 10, with which tool 12 is to be used.

An alternate tool (not shown) would be the electronic package for which socket 10 was designed provided such package could experience solder operations without damage thereto.

Socket 10 includes a number of conductive contact elements 40 and insulative housing 42.

As shown in FIG. 1-B, each contact element 40 includes a pair of spring arms 44 attached to the edges of opposing side walls 46 of U-shaped strap 48 and extending outwardly in the same direction therefrom. Arms 44 converge at the free ends thereof which are provided with contact plates 50. Plates 50 are curved with convex contact surfaces 52 facing each other.

An L-shaped section 54 is attached to an edge of connecting wall or bight 56 of strap 48 and extends outwardly therefrom in an opposite direction relative to spring arms 44. Section 54 includes vertically extending leg 58 and a horizontally extending leg which provides solder foot 60.

The preferred material in making contact elements 40 is beryllium copper and the preferred method of manufacture is by stamping and forming with one method of forming being disclosed below in conjunction with FIGS. 2 through 5. Plating over the opposed contact surfaces 52 would preferably include gold over nickel.

Housing 42, preferably molded from a dielectric polyester plastic such as a polyethelene terephthalate resin, contains a number of contact element-receiving cavities 62 arranged in a specific pattern array which, in socket 10, is a square arraay surrounding an upwardly opened recess 64. The pattern is identical to the square array of conductive pads 16 on circuit board 14. Alignment holes 66, opening out in recess 64, extend through housing 42 and equate in all respects to alignment holes 24 in circuit board 14. Depending posts 68 are provided at each corner 70 of housing 42 and are an integral part thereof. Additional features of housing 42, particularly cavities 62, will be discussed below in conjunction with FIG. 6.

FIGS. 2 through 5 are views wherein the forming of two contact elements 40 are illustrated. In describing the forming, the several portions or segments of an element are referred to by the same descriptive identifiers and reference numerals as the finished portions or segments to provide continuity and to avoid confusion.

As is well known in the stamping and forming art, the items are stamped from flat stock into substantially the final outline prior to forming. Thus, as shown in FIG. 2, the stamping operation defines contact elements 40 in almost all respects. The two elements 40 are connected to carrier strip 72 by connecting straps 74. The drawing in FIG. 2 is after the first forming step wherein straps 74 have been bent at right angles at two points, indicated by reference numerals 76, 78 to define vertical leg 58 and solder foot 60 which comprise section 54. At this stage strap 48 is straight and extends between and connects adjacent elements 40.

FIG. 3 is a view of the two elements 40 after passing through the next forming operation where the portion of strap 48 extending between elements 40 is severed and plates 50 on spring arms 44 are formed into a concavo-convex shape. With adjacent arms 44 being in the same plane, the curving is in one direction and accordingly is a simple forming step.

FIG. 4 is a view after the next forming step in which spring arms 44 have been bent inwardly to slant off the vertical relative to strap 48. The point of bend is at root ends 80 of arms 44; i.e., where arm 44 joins strap 48. The degree or amount of bending displaces plates 50 inwardly a distance approximately equal to one-half the length of bight 56 (FIG. 5) of strap 48. Alternatively, spring arms 44 can be bent over a greater distance to place them in a pre-loaded condition.

As shown in FIG. 5, the final forming step involves bending strap 48 into a U-shape with spring arms 44 being on opposite side walls 46 and slanting in towards each other. Facing convex contact surfaces 52 are very slightly spaced from each other or touching if in the pre-load condition.

The aforementioned plating is advantageously done prior to the above described forming steps.

FIG. 6 is a perspective, partly sectioned view of a portion of housing 42 of socket 10. The section is taken along one side of housing 42 and cuts through cavities 62 immediately adjacent one side wall thereof.

Upper openings 82, leading to cavities 62, are located on upper surface 84 of housing 42. Opening 82 tapers inwardly down to concentrical portion 86. Below portion 86, cavity 62 increases in width between opposing side walls 88, 90. The increased width defines overhang portion 92 joining side wall 88 and overhang portion 94 joining side wall 90.

A rectangular block of material, having a predetermined thickness, projects into cavity 62 from its attachment to side wall 88 and adjacent overhang portion 92 to provide contact element retainer 96. Both side walls 88, 90 include obliquely downwardly facing beveled surfaces 98, 100 respectively adjacent lower opening 102 on housing lower surface 104. Side wall 90 includes a second obliquely downwardly facing beveled surface 106 located above beveled surface 100. Beveled surfaces 98, 100 function to guide contact elements 40 entering cavities 62 through lower opening 102 and beveled surface 106 provides cavities 62 with a wider lower portion to receive strap 48 on contact element 40. Wall 108 and its opposing wall (not shown) which extend between side walls 88, 90 are straight.

A contact element 40 is received in cavity 62 through lower openings 102 without interference until concavo-convex plates 50 encounter retainer 96. Spring arms 44 are separated and resiliently spread apart thereby as element 40 is pushed further into cavity 62. The compressive force exerted against retainer 96 by spring arms 44 is sufficient to retain contact element 40 in cavity 62. Retainer 96 also reduces initial insertion force of posts on electronic packages (not shown) by partially spreading spring arms 44 apart in the same manner as disclosed in U.S. Pat. No. 4,066,316. FIG. 11 shows contact elements 40 fully inserted into cavities 62.

FIGS. 7-A and 7-B illustrate one way in which socket 10 and application tool 12 can be packaged for storage and shipping.

Tray 110, which may be disposable, includes four walls 112 (only one of which is shown), floor 114 and ledge 116 which is provided on floor 114 adjacent walls 112. Walls 112 and floor 114 define upwardly open compartment 118 which receives socket 10.

Tray 110 is preferably made by thermoforming, using polyvinyl chloride which is one of several suitable materials.

As shown in FIG. 7-A, socket 10 with contact elements 40 partially inserted into cavities 62, is placed into compartment 118. Solder feet 60 of contact elements 40 rest on floor 114 and posts 68, depending from housing 42, rest on ledge 116.

Application tool 12, shown above socket 10 in FIG. 7-A, is shown in FIG. 7-B partially mounted on socket 10 with pins 28 inserted into cavities 62 and between spring arms 44 on contact elements 40. Posts 32 on tool 12 are spaced above socket housing surface 84. The compressive forces exerted on partially inserted pins 28 by spring arms 44 hold application tool 12 on socket 10 without need for other restraining means.

Package 120 shown in FIG. 7-B, consisting of socket 10 and application tool 12 in tray 110 may be covered (not shown) to keep dust and moisture out of socket 10.

Figure 8B:
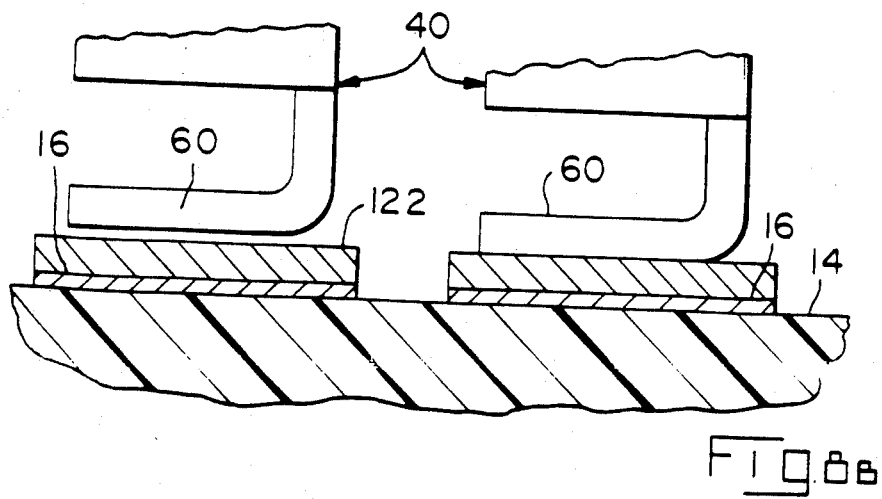
Figure 9A:
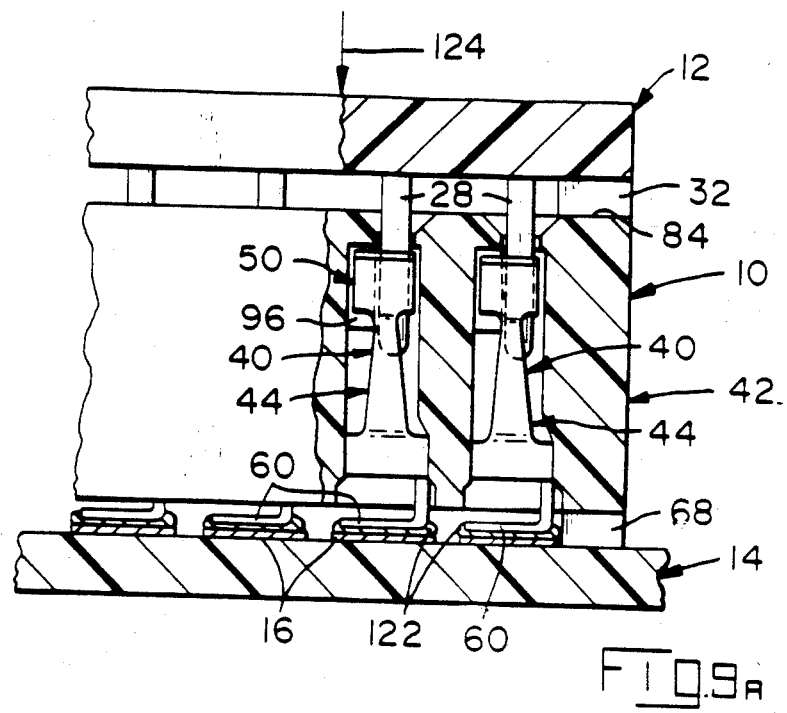
FIG. 9-A is a side elevation, part sectional view of the socket on the circuit board after seating the solder feet in the paste and ready for soldering.
Figure 9B:
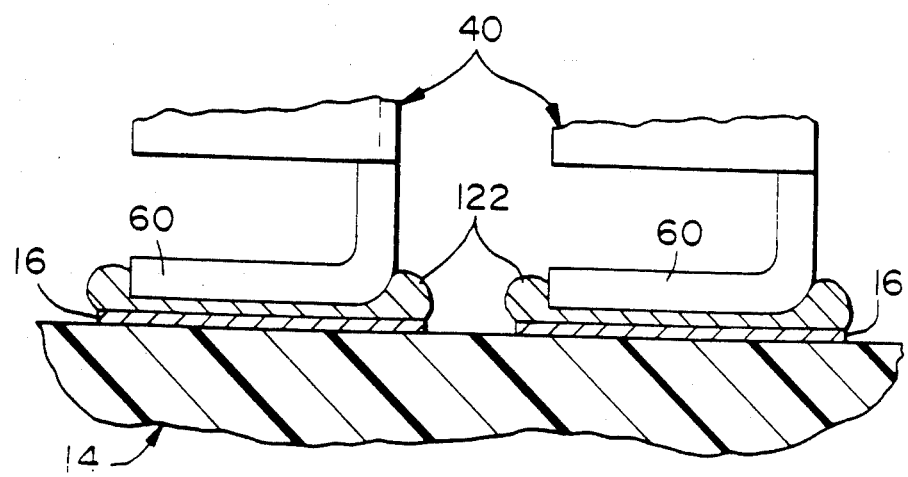

FIGS. 8 and 9 illustrate one method of positioning socket 10 onto circuit board 14 in preparation for soldering. Circuit board 14 will have been previously prepared by screening solder paste 122, having a thickness of about 0.008 inches (0.231 mm), onto each conductive pad 16.

Socket 10 is placed onto circuit board 14, preferably using an alignment tool (not shown) such as disclosed in pending U.S. patent application Ser. No. 444,404, filed on Nov. 26, 1982, in cooperation with alignment holes 24, 66 in board 14 and socket 10, respectively. By using the aforementioned alignment tool, which is manufactured and sold by AMP Incorporated of Harrisburg, Pa., orientation of socket 10 onto board 14 is automatic and solder feet 60 on contact elements 40 are positioned in precise registration with respective conductive pads 16. As shown in FIG. 8-A, posts 68 on socket housing 42 rest on upper surface 18 of board 14 and some solder feet 60 rest on top of solder paste 122. However, due to accumulated tolerances; i.e., an undersized contact element 40, a thinner deposit of solder paste 122 on a conductive pad 16 or a slightly bowed circuit board 14, some solder feet 60; e.g., the second one to the left in FIGS. 8-A and 8-B, do not reach paste 122 but are spaced slightly thereabove. Obviously, a faulty connection would be made if soldering would take place without corrective action being taken. In view of the fact that most solder feet 60 cannot be seen; i.e., obscured by housing 42, faults such as this go undetected.

Application tool 12, having been removed from socket 10 to permit use of the alignment tool, is now replaced for the final positioning of socket 10. For illustrational purposes, application tool 12 is shown in FIG. 8-A as not being pressed completely onto socket 10 but rather spaced thereabove with a gap of about 0.030 inches (0.768 mm) between posts 32 on tool body member 26 and upper surface 84 on socket housing 42.

A greatly enlarged view of two adjacent solder feet 60 on conductive pad 16 with solder paste 122 therebetween is shown in FIG. 8-B. This view illustrates not only the initial positioning of socket 10 on board 14 using the method and application tool 12 of the present invention but also illustrates the oftentime final positioning of a socket on a board where the presently disclosed method and tool 12 is not used.

FIGS. 9-A and 9-B are views showing the final positioning of socket 10 on board 14 in preparation for soldering. As shown in FIG. 9-A, application tool 12 has been pressed down, as indicated by arrow 124, to where posts 32 abut upper surface 84 on housing 42. With pins 28 in between spring arms 44, the frictional forces therebetween move contact elements 40 down so that solder feet 60 are pushed into solder paste 122 on conductive pads 16. Preferably, after seating, a layer of paste 122 having a thickness of about 0.002 inches (0.0514 mm) remains between a solder foot 60 and underlying conductive pad 16. Thinner layers are generally avoided by paste 122 becoming non-compressible under the forces being applied so that pin 28 slides down between spring arms 44 without further moving contact element 40. The layer obviously will be thicker than preferred in those situations where one or more of the aforementioned problems exist but in all but the most extreme cases the thickness will not exceed 0.004 inches (0.103 mm), a thickness which is acceptable in soldering operations.

The greatly enlarged view shown in FIG. 9-B illustrates the uniform thickness of solder paste 122 in both a normal case represented by contact element 40 on the right hand side and the out of tolerance case represented by contact element 40 on the left hand side. Solder feet 60 on both contact elements 40 are adequately seated in paste 122 and the resulting solder joint will be well within the required electrical and mechanical parameters. The view in FIG. 9-B also shows how paste 122 is displaced up around the sides of solder feet 60. This displacement enhances fillet forming during soldering.

Another method for seating solder feet 60 begins with picking socket 10 with application tool 12 thereon from tray 120, either manually or robotically and placing the two components directly onto circuit board 14. In this event, indexing devices (not shown) otherwise supplied by the aforementioned alignment tool, would be required. Cutouts 31 on application tool 12 provide gripping locations for a robot arm (not shown). Pushing on application tool 12 then seats solder feet 60 as described above.

Preferably application tool 12 remains on socket 10 during soldering in that removing it beforehand could cause some dislocation of contact elements 40.

Soldering may be by any of the well known procedures; e.g., vapor phase reflow.

As shown in FIG. 10, application tool 12 and housing 42 are removed from board 14 after soldering. Housing 42 with pins 28 being slightly greater in diameter than the widths of retainers 96 enables tool 12 and housing 42 to be readily removed from contact elements 40. This permits visual inspection of each solder joint 126 as well as inspection of spring arms 44 for damage from pins 28.

As shown in FIG. 11, after inspection, socket 10 is reassembled by reapplying housing 42 onto board 14 with contact elements 40 being received in cavities 62. The engagement of plates 50 with respective retainers 96 serve to adequately maintain housing 42 in position. If desired, positive latch or securing means can be used to latch or secure housing 42 on board 14.

As can be discerned, an electrical socket, an application tool and method for use in surface mounting the electrical socket on a printed circuit board has been disclosed. The use of the tool and method simultaneously and uniformly seats each solder foot on the contact elements of the socket into the solder paste on a respective conductive pad on the circuit board with a high degree of confidence. This method eliminates any gaps that could otherwise occur between the solder feet and solder paste due to accumulated manufacturing tolerances and uneven solder paste disposition. The electrical socket includes contact elements slidably retained in the socket housing. The application tool includes depending pins that are frictionally received between spring arms on the contact elements to provide the force for seating the solder feet independent of the socket housing in which the contact elements are located. After soldering, the socket housing can be removed to permit visual inspection of each individual solder joint.

I claim:

1. An electrical socket for being surface mounted on conductive pads on a circuit board, comprising:
   dielectric housing means having cavities with openings thereto on opposing surfaces and retaining means in each cavity; and
   a plurality of conductive contact means having converging spring arms at one end and solderable means at another end, said contact means being disposed in said cavities with the solderable means extending out through one opening for being soldered to said conductive pads on said circuit board and said spring arms being adjacent another opening for receiving therebetween posts from an electronic package, said contact means being removably retained in said cavities by said spring arms gripping said retaining means.

2. The electrical socket of claim 1 further including concavo-convex shaped plates on free ends of said spring arms with convex surfaces thereon facing each other.

3. The electrical socket of claim 1 wherein said solderable means include a solder foot extending perpendicularly with respect to the longitudinal axis of said contact means.

4. The electrical socket of claim 2 wherein said spring arms are attached to and extend outwardly from opposite sides of a U-shaped strap.

5. The electrical socket of claim 3 wherein said solder foot is attached to an intermediate portion attached to the bight of the U-shaped strap and extending outwardly therefrom in a direction opposite to said spring arms and parallel to the longitudinal axis of said contact means.

6. The electrical socket of claim 1 wherein said dielectric housing means include an upwardly open, centrally located recess and further having a plurality of alignment holes extending therethrough and opening out in said recess.

7. The electrical socket of claim 6 further including depending posts on said dielectric housing means for abutting engagement with said circuit board on which said electrical socket may be mounted.

* * * * *